United States Patent
Schmidhammer

(10) Patent No.: US 10,236,855 B2
(45) Date of Patent: Mar. 19, 2019

(54) TUNABLE RF FILTER CIRCUIT

(71) Applicant: Snaptrack Inc., San Diego, CA (US)

(72) Inventor: Edgar Schmidhammer, Stein an der Traun (DE)

(73) Assignee: SnapTrack, Inc., San Diego, CA (US)

(*) Notice: Subject to any disclaimer, the term of this patent is extended or adjusted under 35 U.S.C. 154(b) by 21 days.

(21) Appl. No.: 15/117,383

(22) PCT Filed: May 30, 2014

(86) PCT No.: PCT/EP2014/061264
§ 371 (c)(1),
(2) Date: Aug. 8, 2016

(87) PCT Pub. No.: WO2015/128004
PCT Pub. Date: Sep. 3, 2015

(65) Prior Publication Data
US 2016/0359466 A1    Dec. 8, 2016

(30) Foreign Application Priority Data
Feb. 26, 2014  (DE) .................. 10 2014 102 521

(51) Int. Cl.
*H03H 7/01*        (2006.01)
*H03H 7/09*        (2006.01)
(Continued)

(52) U.S. Cl.
CPC ........ *H03H 7/0153* (2013.01); *H03H 7/0115* (2013.01); *H03H 7/0123* (2013.01);
(Continued)

(58) Field of Classification Search
CPC ...... H03H 7/0115; H03H 7/0153; H03H 7/09; H03H 7/1758; H03H 7/1775; H03H 7/1791
(Continued)

(56) References Cited

U.S. PATENT DOCUMENTS 4,835,499 A    5/1989  Pickett
5,150,089 A    9/1992  Komazaki
(Continued)

FOREIGN PATENT DOCUMENTS

DE    29508163 U1    7/1995
DE    10202475 A1    8/2003
(Continued)

OTHER PUBLICATIONS

Ching-Wen et al., "Development of Ultra-Wideband LTCC Filter", IEEE Conference on Ultra-Wideband, Sep. 5, 2005, pp. 320-322.
(Continued)

*Primary Examiner* — Rakesh B Patel
(74) *Attorney, Agent, or Firm* — Patterson & Sheridan, L.L.P.

(57) ABSTRACT

A tunable RF filter circuit (AHF) is specified which enables good electrical properties, good tunability and simple driving despite low complexity. In this case, the filter circuit comprises a first and a second signal route (SW1, SW2) in a signal path (E, A). At least three resonant circuits (RK1, RK2, RK3) are arranged one after another in the second signal route and interconnect the second signal route with ground. The resonant circuits are electrically and/or magnetically coupled (K) and each comprise a tunable impedance element. The second signal route contains an impedance element (IMP).

18 Claims, 5 Drawing Sheets

Figure 1:
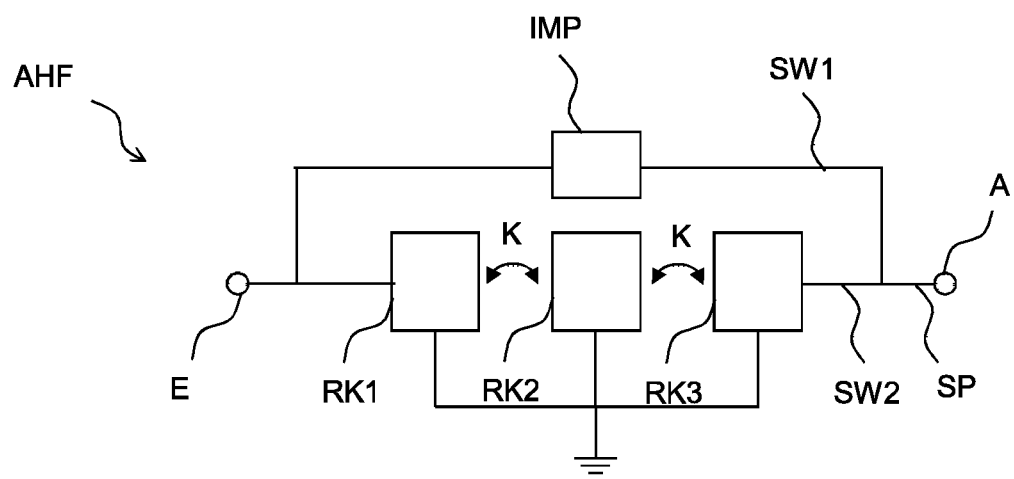

(51) Int. Cl.
*H03H 9/54* (2006.01)
*H03H 9/46* (2006.01)
*H01P 1/203* (2006.01)

(52) U.S. Cl.
CPC ............ *H03H 7/0138* (2013.01); *H03H 7/09* (2013.01); *H03H 7/1708* (2013.01); *H03H 7/1775* (2013.01); *H03H 9/465* (2013.01); *H03H 9/542* (2013.01); *H01P 1/20336* (2013.01)

(58) Field of Classification Search
USPC .......................................... 333/174, 175, 185
See application file for complete search history.

(56) References Cited

U.S. PATENT DOCUMENTS

| | | | |
|---|---|---|---|
| 5,525,942 A | 6/1996 | Horii | |
| 7,323,955 B2 | 1/2008 | Jachowski | |
| 2002/0093400 A1 | 7/2002 | Zhu | |
| 2003/0085780 A1 | 5/2003 | Wang | |
| 2004/0130414 A1* | 7/2004 | Marquardt | H03H 7/0161 333/174 |
| 2004/0183626 A1 | 9/2004 | Kang | |
| 2005/0195541 A1* | 9/2005 | Chen | H03F 1/565 361/58 |
| 2008/0136560 A1* | 6/2008 | Bavisi | H03H 7/0115 333/168 |
| 2008/0252395 A1 | 10/2008 | Liu | |
| 2009/0121807 A1* | 5/2009 | Tomaki | H01P 1/20345 333/185 |
| 2010/0214037 A1 | 8/2010 | Plager | |
| 2013/0076454 A1 | 3/2013 | Imamura | |
| 2013/0120950 A1* | 5/2013 | Tomaki | H01P 1/20345 361/782 |
| 2014/0266544 A1* | 9/2014 | Leipold | H01F 5/003 336/200 |
| 2015/0002240 A1* | 1/2015 | Reiha | H03H 7/0161 333/132 |

FOREIGN PATENT DOCUMENTS

| | | |
|---|---|---|
| EP | 1060232 B1 | 9/1999 |
| EP | 01060232 A1 | 12/2000 |
| EP | 2106023 A1 | 9/2009 |
| JP | 2009516962 A | 4/2009 |
| JP | 2011024254 A | 2/2011 |
| WO | WO 99/43768 A1 | 9/1999 |
| WO | WO 02/084686 A1 | 10/2002 |
| WO | WO-2005088832 A1 | 9/2005 |

OTHER PUBLICATIONS

Hoft et al., "Design of Symmetric Trisection Filters for Compact Low-Temperature Co-Fired Ceramic Realization", IEEE Transactions on Microwave Theory and Techniques, vol. 58, No. Jan. 1, 2010, pp. 165-175.

Jervis et al., "Sensitivity-Based Filter Tuning", Electronics &Wireless World, vol. 94, No. 1627, May 1988, pp. 429-432.

Kadota et al., "Tunable Filters Using Wideband Elastic Resonators", IEEE Transactions on Ultrasonics, Ferroelectrics and Frequency Control, vol. 60, No. 10, Oct. 2013 (8 pages).

International Search Report and Written Opinion—PCT/EP2014/061264—ISA/EPO—dated Nov. 13, 2014.

* cited by examiner

TUNABLE RF FILTER CIRCUIT

CROSS-REFERENCE TO RELATED APPLICATIONS

This application is a U.S. National Stage of International Application No. PCT/EP2014/061264, filed on May 30, 2014, entitled "Tunable HF Filter Circuit," which claims the benefit of Germany Patent Application No. 102014102521.0, filed on Feb. 26, 2014, both of which are incorporated herein by reference in their entireties.

The invention relates to tunable filter circuits for RF signals such as can be used e.g. in non-wired communication devices.

Portable communication devices, WLAN routers, etc. or more generally: transmitting/receiving devices which communicate by means of RF signals, require RF filters in order to separate desired signals from undesired signals. Such filters can be interconnected e.g. in front-end circuits, e.g. in duplexers.

In this case, the filter should perform the task of distributing the signals between a chipset and filters furthermore present, if appropriate. The circuitry outlay should be as low as possible. The filter should be compatible with a multiplicity of different filter technologies of further filters, enable a small structural size of a corresponding component and in particular allow a high selection.

The trend toward communication devices which can operate more and more frequency bands leads to complex interconnections of different filters for the different frequency bands. Therefore, this results in the need for tunable filters in order to be able to utilize different frequency bands with the same filter.

Previous solutions to these requirements are essentially based on extending known filter circuits by tunable impedance elements, or on the use of switches that can be used to supplementarily connect filter elements with respect to a filter topology.

In this regard, the paper "Reconfigurable Multi-band SAW Filters For LTE Applications", Xiao Ming et al., Power Amplifiers For Wireless And Radio Applications (PAWR), 2013 IEEE Topical Conference, Jan. 20, 2013, pages 82-84, discloses substantially conventional RF filters which are reconfigurable by means of switches. In this case, however, filters reconfigurable by means of switches do not enable continuously tunable duplexers.

The paper "Tunable Filters Using Wideband Elastic (?) Resonators", Kadota et al., IEEE Transactions on Ultrasonics, Ferroelectrics and Frequency Control, vol. 60, no. 10, October 2013, pages 2129-2136, discloses filter circuits in which tunable capacitors are added to RF filters with acoustic resonators.

The paper "A Novel Tunable Filter Enabling Both Center Frequency and Bandwidth Tunability", Inoue et al., Proceedings Of The 42$^{nd}$ European Microwave Conference, Oct. 29-Nov. 1, 2012, Amsterdam, The Netherlands, pages 269-272, discloses RF filters comprising tunable capacitors and tunable inductances.

The paper "RFMEMS-Based Tunable Filters", Brank et al., 2001, John Wiley & Sons, Inc. Int. J. RF and Microwave CAE11: pages 276-284, 2001, also discloses interconnections of L and C elements, wherein the capacitances of the capacitive elements are adjustable.

The paper "Design of a Tunable Bandpass Filter With the Assistance of Modified Parallel Coupled Lines", Tseng et al., 978-1-4673-2141-9/13/$31.00, 2013 IEEE, discloses tunable filters with coupled transmission lines.

The paper "Tunable Isolator Using Variable Capacitor for Multi-band System", Wada et al., 978-1-4673-2141-9/13/$31.00, 2013 IEEE MTT-S Symposium, and the publication WO2012/020613 disclose the use of isolators in RF filters.

The paper "Filters with Single Transmission Zeros at Real or Imaginary Frequencies", Levy, IEEE Transactions on Microwave Theory and Techniques, vol. MTT-24, no. 4, April 1976, discloses embodiments of various Chebyshev filters with coupled circuit elements.

For the RF circuits known from the papers cited above it can essentially be stated in summary that known filter topologies by adding variable elements, e.g. switches or adjustable impedance elements, tunable filter circuits are obtained. What is problematic about that is that the known filter topologies used are essentially optimized for the use of impedance elements having a constant impedance. Although tunable filters are made possible, the performance is detrimentally affected here by the tunability.

It is therefore an object of the present invention to specify a circuit topology which offers good performance in the use with tunable circuit elements and in a wide tuning range. In this case, the independent claims specify a tunable RF circuit, a method for driving a tunable RF circuit and an advantageous use of a tunable RF filter. The dependent claims specify advantageous configurations.

A tunable RF filter circuit comprises an input, an output and a signal path. The signal path is arranged between the input and the output and connects the input to the output, such that RF signals which are intended to pass through the filter circuit are conducted from the input to the output. The signal path itself comprises a first signal route and a second signal route. The first signal route and the second signal route run in parallel with one another. An impedance element is interconnected in the first signal route. N≥3—that is to say three or more—resonant circuits are arranged one after another in the second signal route and in each case interconnect the second signal route with ground. Each resonant circuit thus represents as it were a shunt element, such that the resonant circuits constitute parallel-connected connections of the second signal route to ground. The resonant circuits are electrically or magnetically coupled to one another and each comprise at least one tunable impedance element.

This RF filter circuit has a filter topology having intrinsic poles in the transfer characteristic. Said poles could then be used to suppress power spikes of undesired signals, e.g. harmonic or intermodulation products, in a targeted manner. The relative position of the poles in relation to the center frequency further determines the edge steepness, such that the edge steepness can be influenced, e.g. increased by the positioning of the poles.

Furthermore, this topology enables a good adjustability of the bandwidth and of the center frequencies if the corresponding filter should be used as a bandpass filter. The circuitry outlay is low compared with the possible selection. The degree of complexity is relatively low and the outlay required for driving the filter is likewise low.

Besides the good adjustability of the frequencies of the passband edges, a high edge steepness is additionally obtained.

All types of electrical circuits which can be excited to oscillation are appropriate as resonant circuits.

They include e.g. LC circuits, circuits having electro acoustic resonators, ceramic resonators, disk resonators, such as are known from the paper "Distributed Coupling in a Circular Dielectric Disk Resonator and 1$^{st}$ Application to a Square Dielectric Disk Resonator to Fabricate a Low- Profile Dual-Mode BPF", A. C. Kundu and I. Awai, 1998 IEEE MTT-S Digest, pages 837-840, or so-called cavity resonators, such as are known e.g. from the paper "Highly Loaded Evanescent Cavities for Widely Tunable High-Q Filters" by H. Joshi, H. H. Sigmarsson, D. Peroulis and W. J. Chappell, Microwave Symposium, 2007, IEEE/MTT-S International, pages 2133-2136.

It is possible for the impedance element in the first signal route to have a quality factor $Q \leq 100$. The resonant circuits arranged in the signal route can have in each case a quality factor $Q > 100$. The resonant circuits can have a quality factor $Q \leq 200$ by means of coupling elements, e.g. coupled inductive elements, or by means of capacitive elements, a respective electrode of which is assigned to a resonant circuit.

The quality factor Q (also called Q factor) here is a measure of the damping of an oscillatory system. In this case, the value of the quality factor Q is all the higher, the lower the damping. In this case, a quality factor Q is assigned both for a resonant circuit and for individual circuit elements such as capacitive elements or inductive elements.

The RF filter circuit can comprise a respective tunable capacitive element in each of the resonant circuits. Tunable impedance elements—as described below—can also be used for impedance matching.

The value of the capacitance of the capacitive element can be adjusted in order to tune the resonant frequency of the resonant circuit. The tuning of all the resonant circuits of the RF filter circuit then makes it possible to adjust the bandwidth of a bandpass filter, in the form of which the filter circuit can be realized, and the frequency position of the center frequency.

As an alternative thereto, the resonant circuits can also in each case comprise a tunable inductive element in order to adjust the resonant frequencies of the resonant circuits. However, since the realization of a tunable capacitive element is generally simpler, the use of a tunable capacitive element is preferred. In this case, the tunable capacitive elements can be realized as adjustable MEMS capacitances, as varactors or as capacitance banks comprising individually connectable or disconnectable capacitors.

The tunable capacitive elements can have a quality factor $Q > 100$.

The RF filter circuit can be realized such that the ratio of the capacitance values of the tunable capacitive elements is constant if capacitive elements are used as tunable impedance elements. Otherwise the ratio of the inductance values of tunable inductive elements relative to one another can be constant.

This means that only the impedance value of a single tunable impedance element is to be controlled by a logic circuit. The impedance values of the N−1 other tunable impedance elements then results from the scaling of the impedance values to be controlled.

As a result, the driving of the tunable RF filter circuit is significantly simplified since only a single value, e.g. a binary word, which adjusts the required capacitance, has to be transmitted to the filter circuit by a logic circuit, e.g. in the chipset of a mobile communication device, per control interval. In this case, the binary word has n bits and n has at least a magnitude such that any possible adjustable impedance value can be coded with the 2n representable values. In this regard, 256 impedance values are codable e.g. with an 8-bit word.

The tunable RF filter circuit can in each case comprise oscillatory circuit sections in each of its resonant circuits. Said circuit sections can comprise an LC resonant circuit, a ceramic resonator, an MEMS resonator, an acoustic resonator, a disk resonator, a resonator with a wave guiding arrangement integrated in a substrate, or a cavity resonator.

The realization of the individual resonant circuits can be performed independently. The technologies on which the oscillatory circuit sections are based can indeed be identical. However, it is also possible for the oscillatory circuit sections to be based on different technologies.

The use of LC resonant circuits in the resonant circuits enables a simple and cost-effective construction in conjunction with—as a result of the chosen topology—at the same time good electrical properties of the filter. The use of a ceramic resonator, that is to say of a ceramic body, in which recesses with metalized surfaces are structured likewise enables good electrical properties, but in return requires relatively large dimensions. The use of an MEMS (MEMS=Micro Electro Mechanical System) resonator means the use of a resonator in which material is excitable to mechanical oscillation. One example of an MEMS resonator is an acoustic resonator in which a—generally piezoelectric—material is excitable to perform acoustic oscillations.

If the resonator furthermore comprises structured elements which can be used to adjust the wave propagation in a targeted manner, an integrated wave guiding arrangement and thus a resonator with a wave guiding arrangement integrated in a substrate is obtained.

In particular the resonant circuits in which MEMS resonators operate afford good electrical properties in conjunction with at the same time relatively small structural sizes, since the speed of sound is orders of magnitude lower than the speed at which an electrical signal propagates in a conductor.

If the resonant circuits are equipped with oscillatory LC resonant circuits, then an inductive element in the resonant circuit interconnected with the input or output can have an inductance of approximately 1 nH. The capacitance of a tunable capacitive element can be adjustable in a value range around the capacitance value 1 pF.

Capacitive elements which bring about a coupling of resonant circuits can have a capacitance of between 10 fF and 100 pF. Inductive elements which bring about a coupling of resonant circuits can have an inductance of between 1 nH and 300 nF.

Inductive elements in the resonant circuits can have inductances of between 0.1 nH and 50 nH. Capacitive elements in the resonant circuits can have capacitances of between 0.1 pF and 100 pF.

The tunable RF filter circuit can comprise N=4 resonant circuits in the second signal path which are arranged one after another. The impedance element in the first signal route can be an inductive element. The signal path can comprise a respective capacitive element on the input side and on the output side. A capacitive element can thus be interconnected between the input of the signal path and the location at which the signal path splits into the first signal route and the second signal route. Likewise, a capacitive element can be arranged between the output and the location at which the two signal routes recombine.

It is possible for the signal path to comprise in each case one or a plurality of tunable capacitive elements on the input side and/or on the output side.

Such an element which can be interconnected in series in the signal path makes it possible to achieve respectively a matching of the input impedance or of the output impedance. Such a matching may be necessary since the filter circuit is tunable in terms of frequency and tuning of characteristic frequencies such as the center frequency and/or the frequency range requires an impedance matching of the circuit.

The tunable RF filter circuit can furthermore comprise a control logic, i.e. a control circuit in which a circuit logic for controlling the resonant circuits is implemented. In this case, the control logic can be interconnected with the tunable impedance elements of the resonant circuits by means of control lines. The control logic is then provided for controlling the impedance values of the impedance elements. For this purpose, signal lines can be provided which interconnect the control logic in each case with the corresponding tunable impedance element of the resonant circuits.

The tunable RF filter circuit can be configured such that the "outer" resonant circuits, that is to say the resonant circuits which enclose or encompass the remaining resonant circuit(s), have a higher quality factor Q than the enclosed "inner" resonant circuits. In this case, the "outer" resonant circuits are those resonant circuits which are interconnected the nearest with the input or the output. It is generally more important, however, that the resonant circuits have a higher quality factor Q than the coupling elements.

The tunable RF filter circuit can be configured in particular such that the resonant circuits have a higher quality factor Q than the coupling elements used to couple the resonant circuits.

It has been discovered that specific circuit elements of the tunable RF filter circuit react particularly sensitively toward a variation of the quality factor. In contrast thereto, there are circuit elements whose quality factor has virtually no effect on the electrical properties of the filter. In this case, the electrical properties of the filter circuit depend very greatly on the quality factors of the circuit elements in the resonant circuits. In this case, the quality factors of the coupling elements exhibit significantly less influence on the electrical properties of the filter circuit.

This insight can be used to realize insensitive circuit parts by relatively inexpensive components, while the expensive and complex circuit elements having a high quality factor are to be provided only for the sensitive regions of the tunable filter circuit.

Since the less critical circuit regions can thus also be realized by impedance elements of relatively compact construction, the trend toward miniaturization can be followed virtually without losses of quality.

The tunable RF filter circuit can have transfer poles. That is to say that there are frequencies at which the transfer function of the filter circuit has a pole and thus damps signals having precisely these frequency components particularly effectively.

The tunable circuit topology specified thus differs from known tunable circuit topologies in that intrinsic poles exist which, in the known circuit topologies without these intrinsic poles, have to be added by the addition of further impedance elements—generally having a high quality factor.

The tunable RF filter circuit can be used in a transmitting filter and/or a receiving filter, e.g. of a non-wired communication device. Particularly the use in a communication device provided for being able to operate a multiplicity of frequency bands is advantageous. This is because an individual tunable filter can replace two or more filters having non-variable passbands.

In this case, one or more filters having the topology presented can be used in a duplexer which has to separate relatively closely adjacent transmission and reception signals.

A tunable RF filter can be controlled by the following method. In this case, the filter comprises at least N=3 resonant circuits which interconnect a signal route with ground. Each of the resonant circuits comprises a tunable impedance element. The filter furthermore comprises a control logic which controls the tunable impedance elements of the resonant circuits. The method is distinguished in particular by the fact that the control logic always maintains a constant ratio of the impedance values, e.g. of the capacitance values, of the tunable impedance elements, e.g. of the tunable capacitance elements.

In this case, the control logic can receive an information signal of an external circuit environment, e.g. of a chipset of a mobile communication device, and set the impedance value of an impedance element of one of the resonant circuits on the basis thereof. For this purpose, the control logic is interconnected with the corresponding impedance element by means of a signal line. The control logic is furthermore interconnected with the other tunable impedance elements by means of further signal lines and likewise controls their impedance value. In this case, their impedance value results from the fixed ratio of the impedance elements. A multiplicity of discrete control lines to the adjustable impedance elements is thus necessary only starting from the control logic. The interconnection of the chipset with the control logic can be effected by means of signal routes that are kept simple.

In particular driving by means of an MIPI RFFE (MIPI=Mobile Industry Processor Interface, RFFE=RF Front End) is possible.

The individual circuit components of the RF filter circuit can be jointly integrated in a package. Such a package can have a substrate which serves as a carrier for discrete components and additionally has at least one wiring plane. On the top side of the substrate, in a first component position, a semiconductor component can be mounted and electrically connected to the first wiring plane. The semiconductor component has tunable passive components having a high quality factor, which enable a frequency tuning of the filter.

Furthermore, a control unit is arranged in the first component position. The control unit is designed to drive the tunable components and in this way to establish a switching state distinguished by a desired cut-off frequency or a desired frequency band. A dielectric layer is arranged above the first component position. The dielectric layer preferably has an at least largely leveled surface.

Situated above the dielectric layer is a second component position, in which discrete passive components interconnected with the semiconductor component are arranged.

A filter that is tunable with regard to its cut-off frequency or its frequency b and is realized from the tunable passive components, the discrete passive components and, if appropriate, further components. Such a filter can be embodied as a bandpass filter. However, it is also possible to embody the filter as a high-pass filter or as a low-pass filter. A band-stop filter can also be realized as a tunable filter.

The tunable passive components in the semiconductor component can be fabricated in an integrated fashion and interconnected with one another in an integrated fashion. In the semiconductor component, these components can be distributed over the area of the semiconductor component.

The discrete components having a high quality factor that are arranged in the second component position—that is to say above the semiconductor component—can then be provided at an optimally small distance or directly above the circuit nodes or contact areas of the semiconductor component, such that the shortest possible electrical connections between the circuit nodes of the semiconductor component and the discrete passive components can be realized. Short electrical connections have only a small parasitic loss in terms of absolute value per unit length, such that only slight couplings can occur between the connecting lines between the discrete passive components and the semiconductor component or between the connections of these components among one another. Slight couplings have the advantage that the filter has a high frequency accuracy, a high edge steepness and few electrical losses.

A further advantage is that this 3D integration of the components of the filter circuit or the package itself requires a small basic area. By virtue of the fact that long connecting lines are obviated, the package has a smaller volume than conventional tunable filters in the package.

If components having a quality factor of at least 100 are chosen for the components having a high quality factor, that is to say for the discrete components and the tunable components having a high quality factor, then filters having a tuning factor of up to 4:1 can be obtained. Converted to frequency, this corresponds to a factor of 2 between the lowest and highest cut-off frequency or frequency range to be set. For higher frequencies, higher quality factors can be realized in a simpler manner.

Use in a frequency range of between 400 MHz and 8 GHz is possible.

The tunable RF filter circuit and methods for driving a tunable RF filter are explained in greater detail below on the basis of schematic figures and exemplary embodiments.

Figure 2:
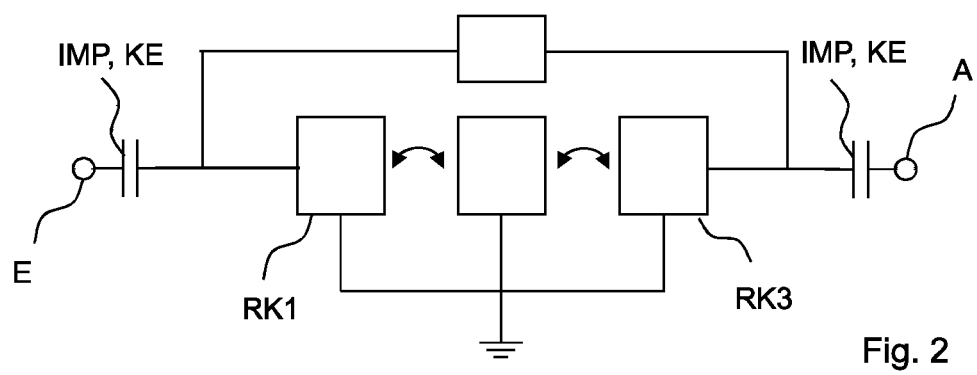
Figure 3:
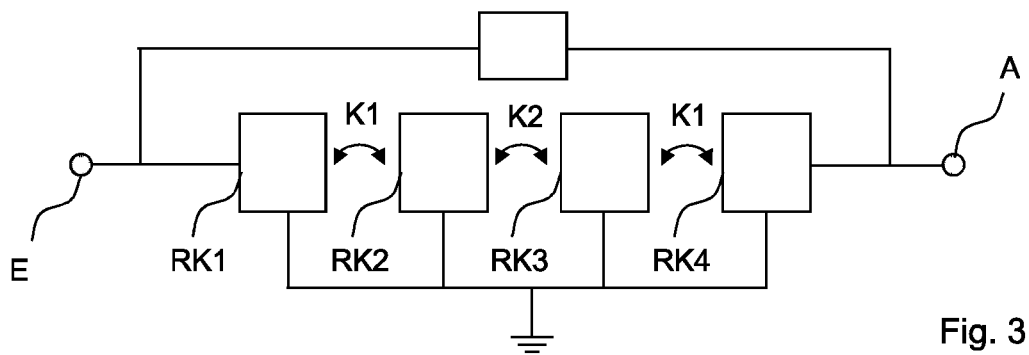
Figure 4:
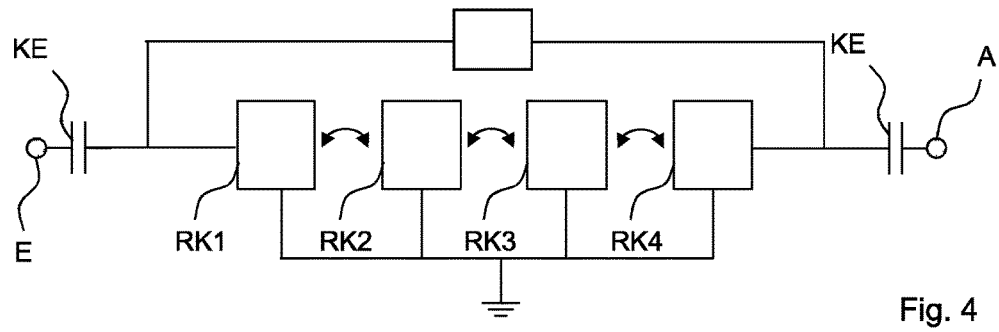
Figure 5:
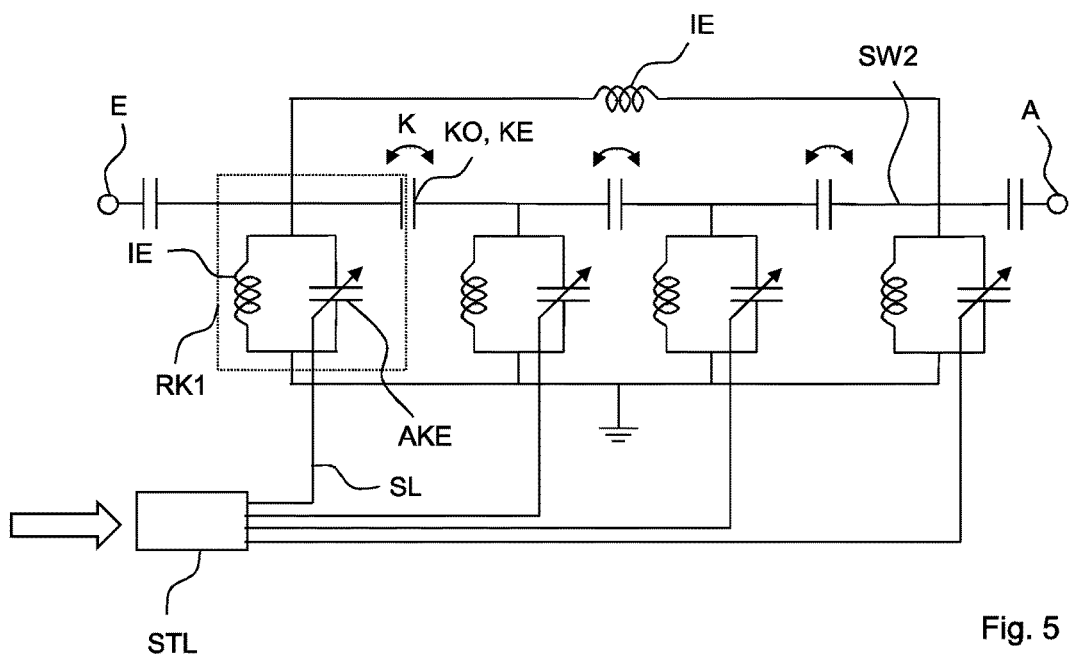
Figure 6:
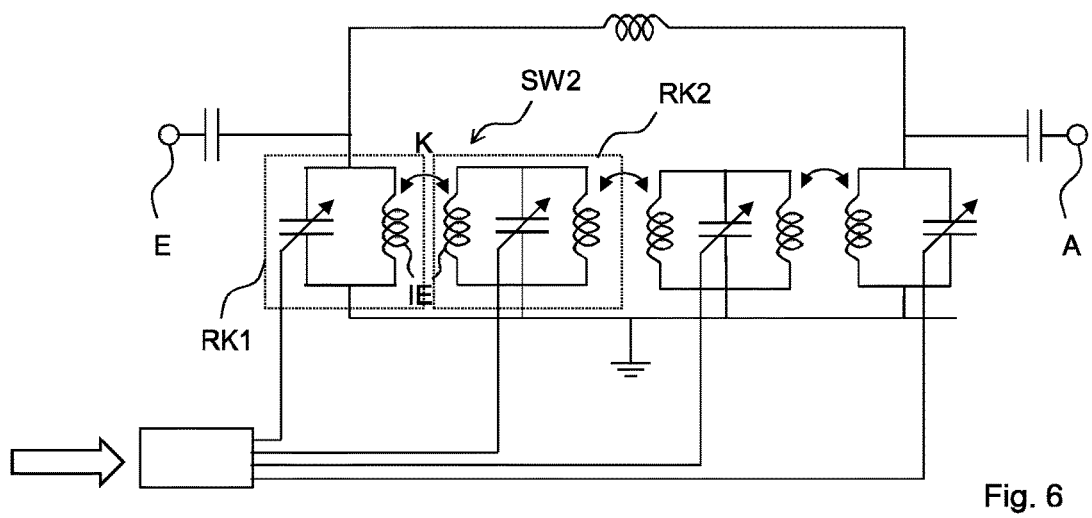
Figure 7:
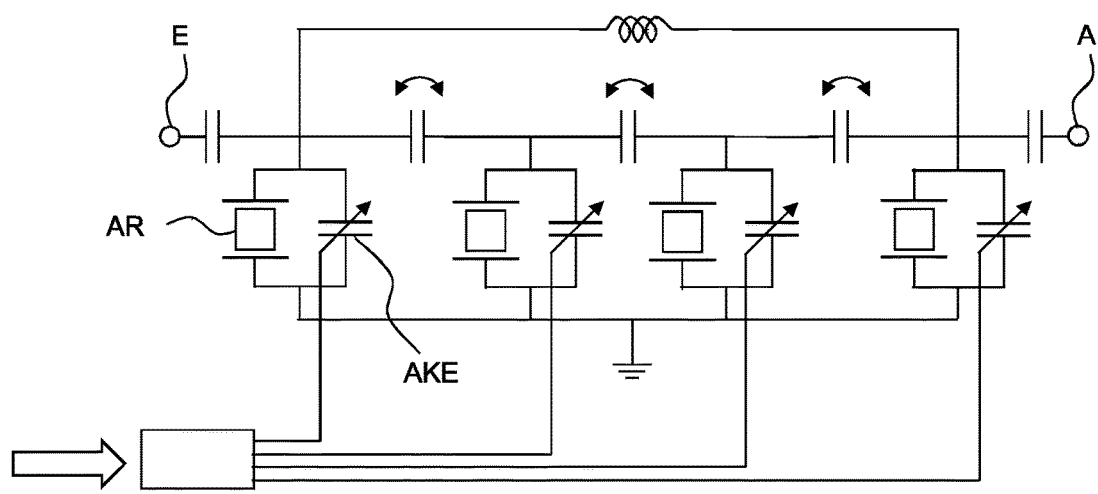
Figure 8:
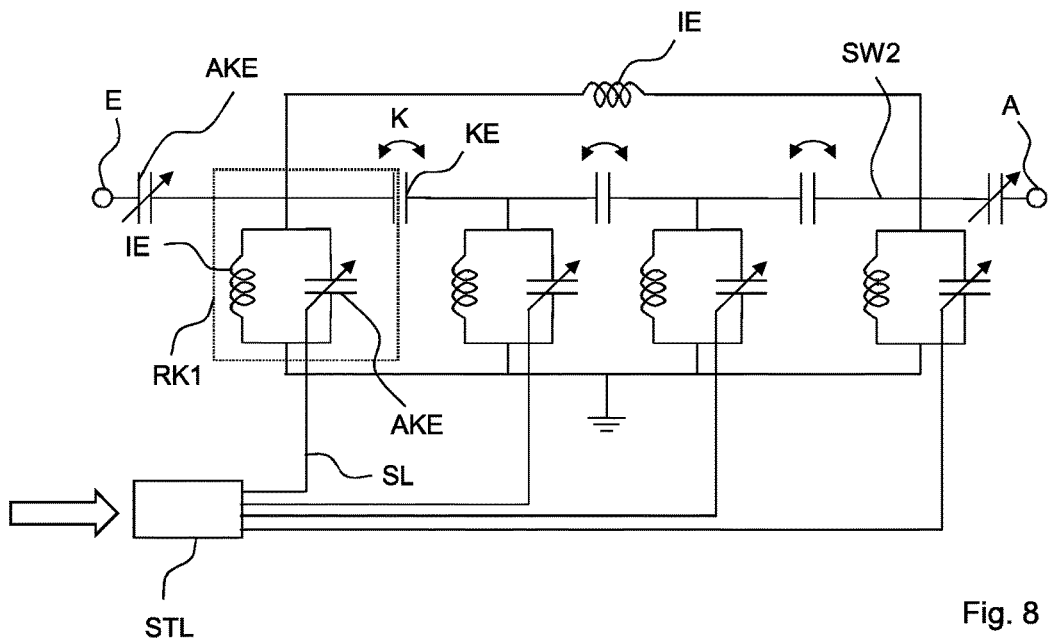
Figure 9:
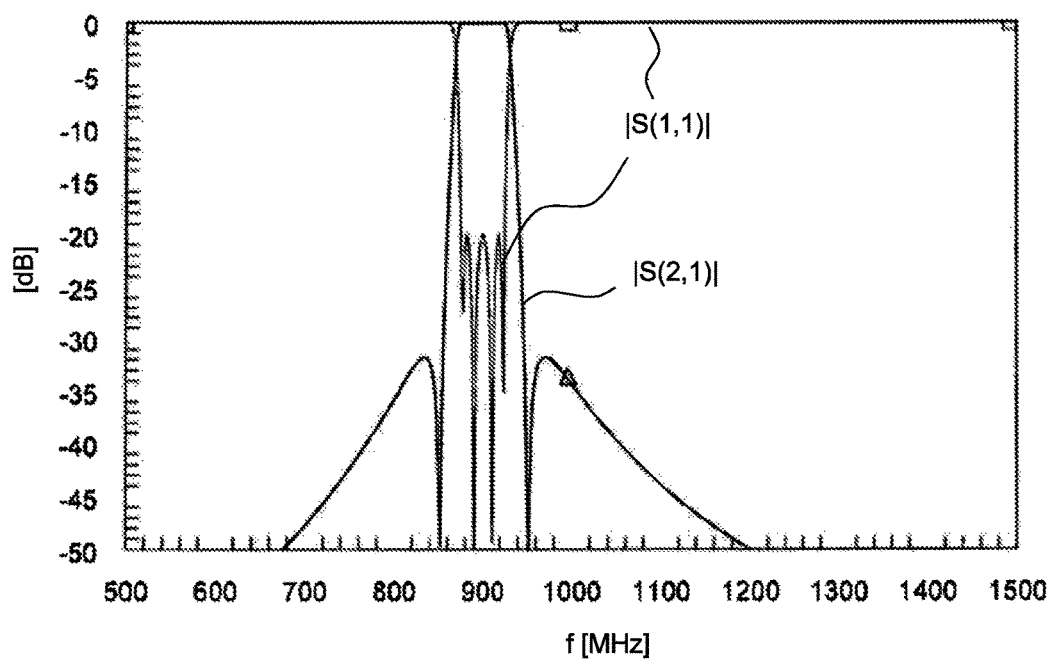
Figure 10:
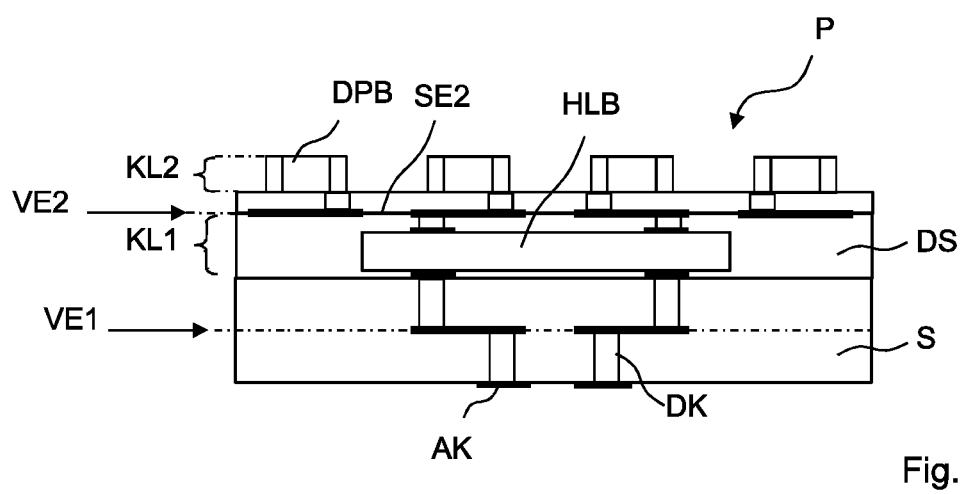

In the figures:

FIG. 1: shows an equivalent circuit diagram of a tunable RF filter circuit,

FIG. 2: shows the equivalent circuit diagram of a filter circuit comprising additional impedance elements, FIG. 3: shows the equivalent circuit diagram of a filter circuit comprising four resonant circuits, FIG. 4: shows the equivalent circuit diagram of a filter circuit comprising four resonant circuits and further capacitive elements, FIG. 5: shows a possible realization of the resonant circuits as LC resonant circuit, FIG. 6: shows inductively coupled resonant circuits, FIG. 7: shows resonant circuits having acoustic resonators, FIG. 8: shows one possible form of the circuit in which the input and/or output impedance is adjustable, FIG. 9: shows calculated frequency dependencies of the matrix elements $S_{1,1}$ and $S_{2,1}$, FIG. 10: shows a cross section through a package for and comprising a tunable filter.

FIG. 1 shows an equivalent circuit diagram of the tunable RF filter circuit AHF, in which a signal path SP is arranged between an input E and an output A. In this case, the signal path SP comprises two parallel-connected partial sections, namely the first signal route SW1 and the second signal route SW2. An impedance element IMP is interconnected in the first signal route SW1. The impedance element IMP can be realized as a capacitive element or as an inductive element. The three resonant circuits RK1, RK2, RK3 are arranged one after another in the second signal route SW2. The resonant circuits are electrically or magnetically coupled and each comprise at least one tunable impedance element. Each of the three resonant circuits interconnects the second signal route with ground.

In this case, the first resonant circuit RK1 is coupled to the input E. In this case, the third resonant circuit RK3 is coupled to the output A. Those resonant circuits which are coupled to the input E or to the output A directly rather than via another resonant circuit constitute the so-called "outer" resonant circuits. These two outer resonant circuits thus enclose the other resonant circuit(s), which thus constitute "inner" resonant circuits.

In the equivalent circuit diagram in FIG. 1, therefore, the first resonant circuit RK1 and the third resonant circuit RK3 constitute the outer resonant circuits, while the second resonant circuit RK2 constitutes the (sole) inner resonant circuit.

The electrical and/or magnetic coupling of the resonant circuits is symbolized by the coupling designated by K. In this case, the first resonant circuit RK1 is electrically and/or magnetically coupled to the second resonant circuit RK2. The second resonant circuit RK2 is also coupled to the third resonant circuit RK3 besides the first resonant circuit RK1.

Via the coupling of the resonant circuits, an electrical signal can be forwarded from resonant circuit to resonant circuit, such that an RF signal can propagate in the second signal route SW2 as well.

FIG. 2 shows an equivalent circuit diagram of the tunable RF filter circuit in which an impedance element IMP is arranged between the input E and the first resonant circuit RK1. In this case, the impedance element is realized as a capacitive element KE. An inductive element at this point is likewise possible, however.

An impedance element IMP likewise realized as a capacitive element is arranged between the third (i.e. the second outer) resonant circuit RK3 and the output A. This capacitive element, too, can be replaced by an inductive element.

FIG. 3 shows the equivalent circuit diagram of the RF filter circuit in which four resonant circuits are present in the second signal route SW2. A fourth resonant circuit RK4 is thus arranged between the third resonant circuit RK3 and the output A. Therefore, the resonant circuits RK1, RK4 form the outer resonant circuits, while the resonant circuits RK2, RK3 form the inner resonant circuits. The couplings between the resonant circuits have the strengths K1 and K2, e.g. as a result of a symmetrical construction.

Furthermore, it is possible for the second signal route SW2 to comprise 5, 6, 7, 8, 9 or 10 resonant circuits that are correspondingly arranged in series between the input E and the output A.

FIG. 4 shows the equivalent circuit diagram of the tunable RF filter circuit in which four resonant circuits RK4 are arranged in the second signal route and in which a capacitive element KE is arranged between the input E and the first resonant circuit RK1.

Furthermore, a further capacitive element KE is arranged between the last outer resonant circuit RK4 and the output A.

FIG. 5 shows an equivalent circuit diagram of the tunable RF filter circuit in which the resonant circuits are realized as LC circuits. Each resonant circuit, shown here on the basis of the example of the first resonant circuit RK1—comprises a parallel connection of an inductive element IE and a tunable capacitive element AKE. The tunable capacitive element AKE in this case constitutes the tunable impedance element of the corresponding resonant circuit. Conversely, each resonant circuit could also comprise a tunable inductive element. The corresponding parallel-connected impedance element of the resonant circuit would then be a capacitive element.

The tunable capacitive element AKE is interconnected with a control logic STL. The control logic STL comprises circuit elements that can be used to receive a control signal of an external circuit environment. The control signal of the external circuit environment is interpreted and control signals are output to the individual tunable capacitive elements AKE via corresponding signal lines SL.

The electromagnetic coupling between the resonant circuits is realized by a capacitive coupling of capacitive elements KE as coupling elements KO. For this purpose, each resonant circuit essentially comprises an electrode of a capacitive element KE via which it is coupled to the adjacent resonant circuit or the adjacent resonant circuits. In this case, a coupling via capacitive elements KE essentially constitutes a capacitive electrical coupling. In this case, the quality factor Q of said capacitive elements is permitted to be lower than the quality factor Q of the elements used in the resonant circuits.

FIG. 6 shows the equivalent circuit diagram of the tunable RF filter circuit in which the coupling between the resonant circuits RK is effected inductively. In this case, each resonant circuit has at least one inductive element IE via which a coupling to another inductive element of the corresponding resonant circuit is effected. Since the first resonant circuit RK1 is only inductively coupled to the second resonant circuit RK2, the first resonant circuit RK1 needs only one inductive element IE1 for coupling. The second resonant circuit RK2 is inductively coupled both to the first resonant circuit RK1 and to the third resonant circuit and therefore requires two inductive elements.

Whether the resonant circuits are coupled inductively or capacitively is unimportant for the fact that RF signals can be transmitted, such that the series arrangement of resonant circuits constitutes the second signal route SW2.

The capacitive elements for coupling between the resonant circuits in FIG. 5 and the inductive elements for coupling the resonant circuits in FIG. 6 are in this case arranged and configured such that the correct degree of coupling is obtained. In this case, the degree of coupling can be set by the distance between the electrodes or the electrode area or the coil shape, coil size and coil distance.

In each case two inductively coupled inductive elements of adjacent resonant circuits here essentially form a transformer circuit.

FIG. 7 shows an equivalent circuit diagram of the tunable RF filter circuit in which the resonant circuits comprise an acoustic or ceramic resonator AR besides a tunable capacitive element AKE. Acoustic or ceramic resonators are distinguished by high quality factors and at the same time by small dimensions. However, since they cause comparatively high production costs and require measures for decoupling and for protection against interfering ambient conditions on account of their mechanical mode of operation, the use of LC components may be preferred.

FIG. 8 illustrates the possibility for impedance matching on the basis of the example of the input impedance. By varying the capacitances of the capacitive elements AKE of the first resonant circuit RK1 and of the capacitive element AKE interconnected at the input E, the filter circuit is able to adjust the input impedance of the circuit. On the output side, too, it is possible to use corresponding tunable impedance elements, e.g. capacitive elements, in series at the output A or with respect to ground in the last resonant circuit for adjusting the output impedance. The regulation can likewise be effected by means of the control logic STL. A capacitance of the capacitive element at the input E with a magnitude of 5 pF and a capacitance of the capacitive element in the first resonant circuit RK1 with a magnitude of 34.34 pF enable an input impedance of 5Ω, for example, such that for instance an impedance matching to an amplifier circuit can be obtained. A capacitance of the capacitive element at the input E with a magnitude of 18 pF and a capacitance of the capacitive element in the first resonant circuit RK1 with a magnitude of 38.81 pF enable an input impedance of 50Ω, for example, such that for instance standard impedance of this magnitude can be obtained.

The profile of the transfer function remains substantially unchanged as a result of the adjustment of the input or output impedances.

FIG. 9 shows calculated frequency dependencies of the insertion loss $|S_{2,1}|$ and the reflection $|S_{1,1}|$. In the insertion loss, a passband with steep edges in the transition region is formed. The insertion loss is low within the passband. Outside the passband, the degree of reflection is so great that virtually no RF power can pass through the filter circuit.

Two poles exist outside the passband.

Four poles exist within the passband, and can be attributed to four resonant circuits.

FIG. 10 shows a simple exemplary embodiment of a package in which the RF filter circuit with its components can be integrated. The package is constructed on a substrate S, which is a mono- or multilayer substrate and has at least one wiring plane VE1. The wiring plane VE1 can be formed on the surface of the substrate S or, as illustrated in FIG. 1 between two insulating layers of a multilayer substrate. On the substrate, at least one semiconductor component HLB is mounted and electrically connected to the first wiring plane VE1. Besides the semiconductor component HLB, further discrete, integrated or other components (not illustrated in the figure) can be arranged on the substrate S in the first component position KL1. The semiconductor component HLB comprises at least high-quality-factor tunable passive components.

A control unit can be integrated in the semiconductor component HLB. The control unit can also be realized as a further separate semiconductor component and be arranged in the first component position KL1.

The components of the first component position KL1 are covered with a dielectric layer DS or embedded into a dielectric layer DS, which terminates toward the top with an approximately planar surface. A second component position KL2 is provided above the dielectric layer DS with the first component position KL1 embedded or arranged underneath in a covered manner. Discrete passive components DP having a high quality factor are arranged in said second component position. The discrete passive components DPB having a high quality factor are electrically interconnected with the components of the first component position KL1. This can be effected directly via plated-through holes DK from the components of the second component position KL to the contacts of the semiconductor components HLB in the first component position KL1. However, it is also possible, as illustrated in the figure, to provide a second wiring plane VE2 between the first and second component positions KE1, KE2. The line sections of the second wiring plane VE2 are electrically connected to the corresponding contacts of the discrete passive components DPB and likewise to contacts of the semiconductor components by means of plated-through holes DK. The second wiring plane VE2 can be embedded between two layers of a dielectric.

External contacts AK are provided at the underside of the substrate S, said external contacts being connected via plated-through holes DK either directly to the components of the first component position KL1 or, as illustrated in the figure, to the first wiring plane SE1. FIG. 1 does not illustrate further passivations or protective coverings which seal the components of the package P against environmental influences. Such a passivation may be for example at least one layer deposited or applied directly onto the surface of the discrete passive components, in particular a thin-film layer. The passivation can also comprise a layer sequence of deposited or applied layers. By way of example, it is possible to apply a first positively locking covering to the discrete passive components DPB, which covering terminates with the surface of the dielectric layer DS. This may be a thermoplastic film, for example. Said film can subsequently be provided with a metallization which, if appropriate, can also be reinforced electrolytically or in an electroless manner.

It is also possible to enlarge the surface of the substrate S compared with the region provided with components and to cause the passivation to terminate with the then projecting substrate surface. Furthermore, it is possible to place a rigid and mechanically dimensionally stable cap onto the surface of the dielectric layer DS or onto projecting surface regions of the substrate S and to seal it with respect thereto. Both with a positively locking covering and with a rigid cap, afterward a potting of the entire package P can also be effected, wherein advantageously either a glob top compound is applied or the whole thing is encapsulated with a plastics compound by injection molding.

The tunable RF filter circuit is not restricted to the circuit details shown. Filter circuits having further circuit elements such as e.g. capacitive elements, inductive elements or resonant circuits are likewise encompassed by the filter circuit.

LIST OF REFERENCE SIGNS

|S1,1|: Reflection
|S2,1|: Insertion loss
A: Output
AHF: Tunable radio-frequency (RF) filter circuit
AK: External contact
AKE: Tunable capacitive element
AR: Acoustic resonator
DK: Plated-through hole
DPE: Discrete passive component
DS: Dielectric layer
E: Input
HLB: Semiconductor component
IE: Inductive element
IMP: Impedance element
K: Electrical and/or magnetic coupling
KE: Capacitive element
KL1, KL2: First, second component position
KO: Coupling element
P: Package
RK,RK1-4: Resonant circuit
S: Substrate
SL: Control line
SP: Signal path
STL: Control logic
SW1: First signal route
SW2: Second signal route
VE1, VE2: First, second wiring plane

The invention claimed is:
1. A tunable RF filter circuit, comprising:
an input, an output and therebetween a signal path having a first signal route and a second signal route in parallel with the first signal route;
an impedance element interconnected in the first signal route, the impedance element having a first terminal directly connected to a first node and a second terminal directly connected to a second node; and
a plurality of resonant circuits, each of the plurality of resonant circuits interconnecting the second signal route with electric ground, wherein:
the plurality of resonant circuits comprise N resonant circuits, N being greater than 3;
each of the plurality of resonant circuits is directly connected to a different node of the second signal route, the different nodes being between first and second terminals of the second signal route, the first terminal of the second signal route being directly connected to the first node and the second terminal of the second signal route being directly connected to the second node;
each of the plurality of resonant circuits is at least one of electrically or magnetically coupled to another resonant circuit of the plurality of resonant circuits and each of the plurality of resonant circuits comprises a tunable impedance element; and
the plurality of resonant circuits have a higher quality factor Q than coupling elements which couple the plurality of resonant circuits together.

2. The tunable RF filter circuit of claim 1, wherein each of the plurality of resonant circuits comprises an inductive element magnetically coupled to the inductive element of another one of the plurality of resonant circuits.

3. The tunable RF filter circuit according to claim 1, wherein the tunable impedance element of each of the plurality of resonant circuits comprises a tunable capacitive element.

4. The tunable RF filter circuit according to claim 3, wherein each of the tunable capacitive elements have a quality factor Q>100.

5. The tunable RF filter circuit according to claim 3, wherein a ratio of capacitance values of each of the tunable capacitive elements in the plurality of resonant circuits is constant.

6. The tunable RF filter circuit according to claim 1, wherein each of the plurality of resonant circuits comprises an oscillatory circuit section selected from: an LC resonant circuit, a ceramic resonator, an MEMS resonator, an acoustic resonator, a resonator with a wave guiding arrangement integrated in a substrate, and a cavity resonator.

7. The tunable RF filter circuit according to claim 1, wherein:
four of the plurality of resonant circuits are arranged one after another in the second signal route;
the impedance element in the first signal route is an inductive element; and
the signal path comprises a respective capacitive element on an input side and on an output side of the signal path.

8. The tunable RF filter circuit according to claim 1, wherein the signal path comprises a respective tunable capacitive element on at least one of an input side or an output side of the signal path.

9. The tunable RF filter circuit according to claim 1, further comprising a control logic which is interconnected with the respective tunable impedance elements of the plurality of resonant circuits by means of control lines and is configured to control impedance values of the corresponding tunable impedance elements.

10. A method for driving the tunable RF filter according to claim 1, wherein:
the tunable RF filter further comprises control logic that controls an impedance value of each of the tunable impedance elements; and the control logic maintains a constant ratio of the impedance values of the tunable impedance elements.

11. The tunable RF filter circuit according to claim 1, wherein a transfer curve of the tunable RF filter circuit includes poles.

12. At least one of a transmitting filter or a receiving filter of a communication device comprising the tunable RF filter circuit according to claim 1.

13. The tunable RF filter circuit according to claim 1, wherein:
the impedance element in the first signal route has a quality factor Q<100;
each of the plurality of resonant circuits arranged in the second signal route has a quality factor Q>100; and
the coupling elements have a quality factor Q<200.

14. The tunable RF filter circuit according to claim 2, wherein each of the plurality of resonant circuits comprises a tunable capacitive element.

15. The tunable RF filter circuit according to claim 14, wherein a ratio of capacitance values of the tunable capacitive elements in the plurality of resonant circuits is constant.

16. A tunable RF filter circuit, comprising:
an input, an output and therebetween a signal path having a first signal route and a second signal route in parallel with the first signal route;
an impedance element interconnected in the first signal route, the impedance element having a first terminal directly connected to a first node and a second terminal directly connected to a second node; and
a plurality of resonant circuits, each of the plurality of resonant circuits interconnecting the second signal route with electric ground, wherein:
the plurality of resonant circuits comprise N resonant circuits, N being greater than three;
each of the plurality of resonant circuits is directly connected to a different node of the second signal route, the different nodes being between first and second terminals of the second signal route, the first terminal of the second signal route being directly connected to the first node and the second terminal of the second signal route being directly connected to the second node;
each of the plurality of resonant circuits is at least one of electrically or magnetically coupled to another resonant circuit of the plurality of resonant circuits and each of the plurality of resonant circuits comprises a tunable impedance element;
the tunable impedance elements have a quality factor Q>100; and
each resonant circuit of the plurality of resonant circuits has a higher quality factor Q than a coupling element which couples the resonant circuit to another resonant circuit.

17. The tunable RF filter circuit according to claim 16, wherein each of the plurality of resonant circuits comprises an oscillatory circuit section selected from: an LC resonant circuit, a ceramic resonator, an MEMS resonator, an acoustic resonator, a resonator with a wave guiding arrangement integrated in a substrate, and a cavity resonator.

18. A tunable RF filter circuit, comprising:
an input, an output and therebetween a signal path having a first signal route and a second signal route in parallel with the first signal route;
an impedance element interconnected in the first signal route, the impedance element having a first terminal directly connected to a first node and a second terminal directly connected to a second node; and
a plurality of resonant circuits, each of the plurality of resonant circuits interconnecting the second signal route with electric ground, wherein:
the plurality of resonant circuits comprise N resonant circuits, N being greater than 3;
each of the plurality of resonant circuits is directly connected to a different node of the second signal route, the different nodes being between first and second terminals of the second signal route, the first terminal of the second signal route being directly connected to the first node and the second terminal of the second signal route being directly connected to the second node;
each of the plurality of resonant circuits is at least one of electrically or magnetically coupled to another resonant circuit of the plurality of resonant circuits and each of the plurality of resonant circuits comprises a tunable impedance element; and
the tunable impedance element of each of the plurality of resonant circuits comprises a tunable capacitive element, each of the tunable capacitive elements having a quality factor Q>100.

* * * * *